(12) United States Patent
Briggs et al.

(10) Patent No.: US 9,793,206 B1
(45) Date of Patent: Oct. 17, 2017

(54) HETEROGENEOUS METALLIZATION USING SOLID DIFFUSION REMOVAL OF METAL INTERCONNECTS

(71) Applicant: International Business Machines Corporation, Armonk, NY (US)

(72) Inventors: Benjamin D. Briggs, Waterford, NY (US); Lawrence A. Clevenger, LaGrangeville, NY (US); Bartlet H. DeProspo, Goshen, NY (US); Huai Huang, Saratoga, NY (US); Christopher J. Penny, Saratoga Springs, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/280,518

(22) Filed: Sep. 29, 2016

(51) Int. Cl.
| | |
|---|---|
| *H01L 21/4763* | (2006.01) |
| *H01L 23/522* | (2006.01) |
| *H01L 23/532* | (2006.01) |
| *H01L 23/528* | (2006.01) |
| *H01L 21/768* | (2006.01) |

(52) U.S. Cl.
CPC ...... *H01L 23/5226* (2013.01); *H01L 21/7684* (2013.01); *H01L 21/76816* (2013.01); *H01L 21/76828* (2013.01); *H01L 21/76834* (2013.01); *H01L 21/76877* (2013.01); *H01L 23/5283* (2013.01); *H01L 23/53209* (2013.01); *H01L 23/53214* (2013.01); *H01L 23/53228* (2013.01); *H01L 23/53233* (2013.01); *H01L 23/53242* (2013.01); *H01L 23/53257* (2013.01)

(58) Field of Classification Search
CPC ......... H01L 21/02321; H01L 21/76822; H01L 21/76823; H01L 21/76834; H01L 21/76883
See application file for complete search history.

(56) References Cited

U.S. PATENT DOCUMENTS

| | | |
|---|---|---|
| 5,470,788 A | 11/1995 | Biery et al. |
| 6,927,113 B1 * | 8/2005 | Sahota ................ H01L 23/5329 257/E21.579 |

(Continued)

OTHER PUBLICATIONS

H. Miyazaki et al., "Passivation effect of silicon nitride against copper diffusion", Journal of Applied Physics, vol. 81, No. 12, pp. 7746-7750, published Jun. 15, 1997.*

(Continued)

*Primary Examiner* — Meiya Li
*Assistant Examiner* — Peter M Albrecht
(74) *Attorney, Agent, or Firm* — Cantor Colburn LLP; Vazken Alexanian

(57) ABSTRACT

A method for forming trenches of an interconnect network in a substrate. The method includes forming a first trench in the substrate, which has a first width. The method also includes forming a second trench in the substrate, which has a second width that is greater than the first width. The method also includes depositing a metal layer into the trenches, applying a dielectric over the metal, and diffusing metal atoms from the trenches to the dielectric. The dielectric absorbs a majority of the metal atoms from the first trench while simultaneously absorbing only a minority of metal atoms from the second trench.

10 Claims, 9 Drawing Sheets

(56) References Cited

U.S. PATENT DOCUMENTS

| | | |
|---|---|---|
| 7,790,617 B2 | 9/2010 | Lim et al. |
| 8,796,854 B2 | 8/2014 | Yang et al. |
| 2009/0317972 A1* | 12/2009 | Anderson ......... H01L 21/76886 |
| | | 438/630 |
| 2013/0026635 A1 | 1/2013 | Yang et al. |
| 2014/0284801 A1 | 9/2014 | Kitamura et al. |
| 2014/0291819 A1 | 10/2014 | Barth |
| 2014/0319685 A1 | 10/2014 | Bao et al. |
| 2016/0071791 A1 | 3/2016 | Huang et al. |
| 2016/0093566 A1* | 3/2016 | Ting ................... H01L 23/5226 |
| | | 257/774 |

OTHER PUBLICATIONS

Benjamin D. Briggs, et al., "Heterogeneous Metallization Using Solid Diffusion Removal of Metal Interconnects", U.S. Appl. No. 15/434,335, filed Feb. 16, 2017.

List of IBM Patents or Patent Applications Treated as Related—Date Filed: Sep. 29, 2016; 2 pages.

Anonymous, "Hybrid refractory metal-copper wiring metalization scheme for integrated circuits", IP.com Prior Art Database Technical Disclosure, IPCOM000223293D, Nov. 15, 2012.

\* cited by examiner

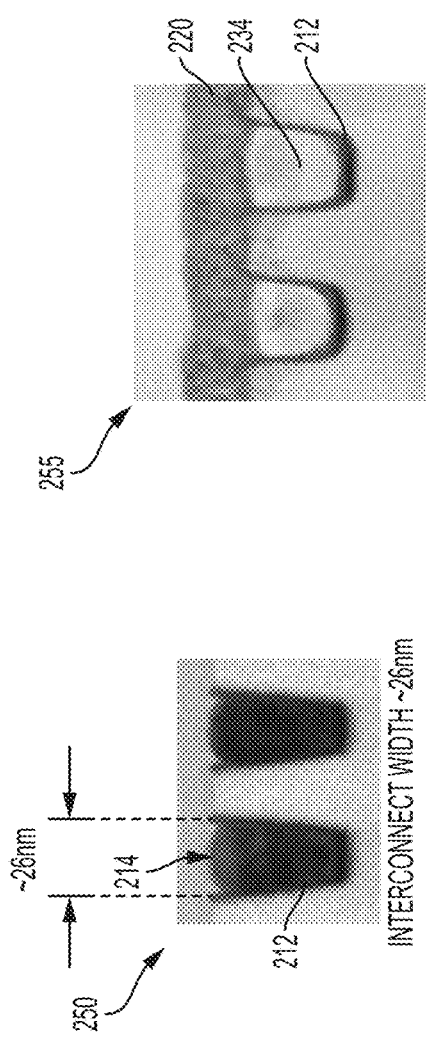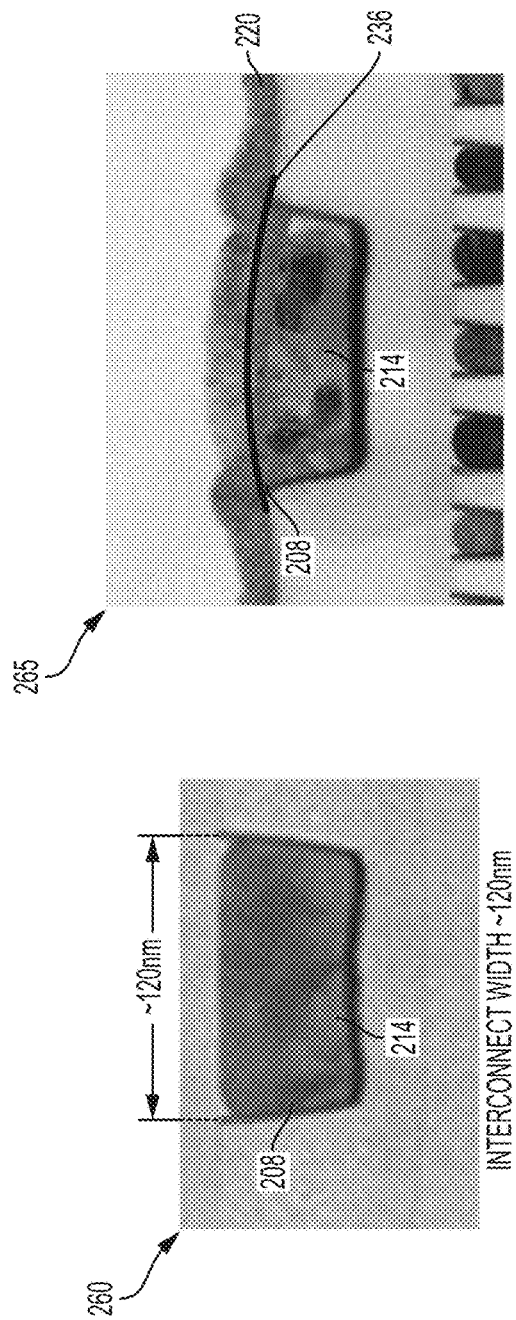

HETEROGENEOUS METALLIZATION USING SOLID DIFFUSION REMOVAL OF METAL INTERCONNECTS

BACKGROUND

The present invention relates in general to the field of semiconductor fabrication methodologies and resulting device structures. More specifically, the present invention relates to fabrication methodologies and resulting structures for a semiconductor device having a heterogeneous metal interconnect structure containing both narrow and wide trenches or lines that can be formed simultaneously.

Semiconductor devices and components, which are referred to collectively herein as integrated circuit (IC) components, include a plurality of circuit elements (e.g., transistors, resistors, diodes, capacitors, etc.) communicatively connected together on a semiconductor substrate (i.e., a wafer or a chip). IC components are coupled to one another by providing a network of interconnected metallization layers and conductive trenches formed in the wafer/chip. Metallization layers and trenches are often formed using copper (Cu), which facilitates the development of smaller metal components, reduced energy usage, and higher-performance processors. Efficient routing of these metallization layers and trenches through multi-layered chip designs requires the formation of multi-level or multi-layered metallization layer and trench patterning schemes.

SUMMARY

Embodiments are directed to a method for forming trenches of an interconnect network in a substrate. The method includes forming a first trench in the substrate, with the first trench having a first width dimension. Next, forming a second trench in the substrate, with the second trench having a second width dimension that is greater than the first width dimension. Next, depositing a first metal layer into the first and second trenches and applying a dielectric layer over the metal layer. The method further includes diffusing metal atoms from the first and second trenches to the dielectric layer, where the dielectric layer absorbs a majority of the metal atoms from the first trench while simultaneously absorbing only a minority of metal atoms from the second trench.

Embodiments are further directed to a device with an interconnect network of trenches in a substrate. The device includes a first trench having a first width dimension and a second trench having a second width dimension that is greater than the first width dimension. The device also includes a first metal layer in the second trench and a second metal layer in the first and second trenches, with the second metal layer located over any first metal present in the trenches. The device also includes a hybrid interconnection structure of first and second trenches containing the first and second metals, where the hybrid interconnection structure is formed simultaneously, and a dielectric layer.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 9A depicts a Transmission Electron Microscopy (TEM) of a substrate having narrow trenches containing copper before the process of removing the copper from the trenches has begun according to embodiments;

FIG. 9B depicts a TEM image of a substrate having narrow trenches, an added dielectric layer, and after the migration of copper to the dielectric layer, wherein the trenches devoid of copper according to embodiments;

FIG. 9C depicts a TEM image of a substrate having a wide trench containing copper before the process of removing the copper from the trench has begun according to embodiments; and FIG. 9D depicts a TEM image of a substrate having a wide trench, an added dielectric layer, and after the migration of copper to the dielectric layer, wherein the wide trench retains the majority of copper present beforehand according to embodiments.

Figure 1:
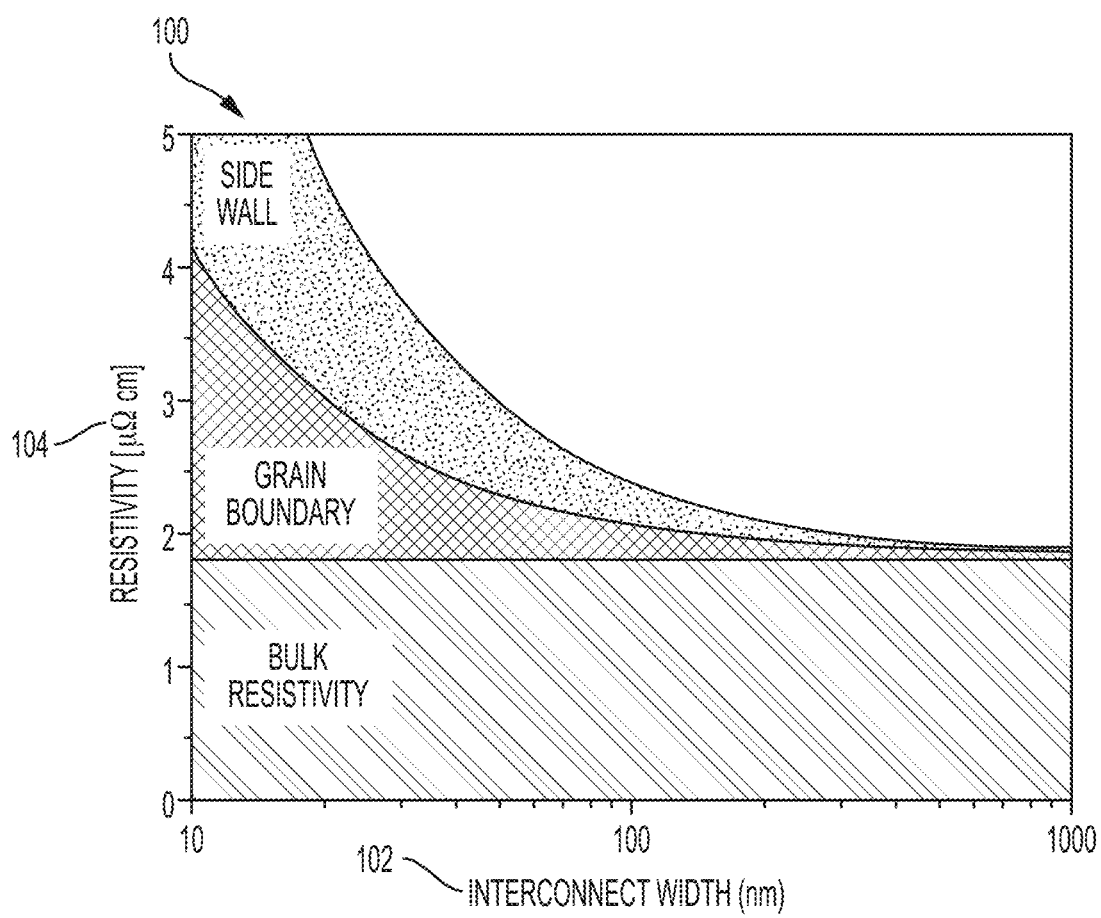
FIG. 1 depicts a graph displaying the resistivity of copper as a function of trench width.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting. In the drawings, like numbering represents like elements.

DETAILED DESCRIPTION

Various embodiments of the present invention will now be described with reference to the related drawings. Alternate embodiments can be devised without departing from the scope of this invention. Various connections might be set forth between elements in the following description and in the drawings. These connections, unless specified otherwise, can be direct or indirect, and the present invention is not intended to be limiting in this respect. Accordingly, a coupling of entities can refer to either a direct or an indirect connection.

The terminology used herein is for the purpose of describing particular embodiments only and is not intended to be limiting of this invention. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of one or more of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, or substrate is referred to as being "on" or "over", or "disposed on" another element, it can be directly on the other element or intervening elements can also be present. In contrast, when an element is referred to as being "directly on", "directly over", or "disposed proximately to" another element, there are no intervening elements present. It will also be understood that when an element is referred to as being "connected" or "coupled" to another element, it can be directly connected or directly coupled to the other element, or intervening elements can be present. In contrast, when an element is referred to as being "directly connected" or "directly coupled" to another element, there are no intervening elements present.

For the sake of brevity, conventional techniques related to semiconductor device and integrated circuit fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based integrated circuits are well-known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of semiconductor devices according to the present invention utilize a variety of individually known physical and chemical processes performed on a semiconductor (e.g., silicon) substrate, some of which are described in the following immediately following paragraphs.

In general, the various processes used to form a microchip that will be packaged into an integrated circuit fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions or even billions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are on a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to embodiments of the present invention, an interconnect network includes a configuration of metallization layers/lines and metal trenches. The metal trenches are disposed in trenches and run perpendicular to the semiconductor substrate. The trenches are formed in a dielectric material. The metal trenches are communicatively connected to the metallization layers/lines. The metal trenches can also run parallel to the semiconductor substrate.

An interconnect network that is copper based, when compared with an aluminum (Al) based interconnect network, can allow higher speed signal transmissions between large numbers of transistors on a complex semiconductor chip. Accordingly, when fabricating an IC, a metal conductor such as copper is typically used for forming the interconnect network because copper has a low resistivity and high current carrying capacity as compared to aluminum.

Resistivity is the measure of how much a material opposes electric current caused by a voltage being placed across the material as a function of length. However, when copper is utilized to form an interconnect network, electromigration can occur when using copper in trenches with very small dimensions. In the present description, electromigration effects become significant as trenches become smaller in width, and are referred to as "narrow" or "first" trenches with a first width of less than 30 nm. Trenches with a width of greater than 30 nm are termed "wide" or "second" trenches. Electromigration is the gradual displacement of atoms of a metal conductor due to the high density of current passing through the metal conductor.

For high-speed and low-power operation, the resistivity of copper trenches should be relatively low as compared to other materials. In addition, the ability of the materials used to form the trenches to minimize electromigration should be pronounced. A material such as Tantalum Nitride (TaN) can be used as a barrier layer at the bottom of the trenches. When the TaN barrier layer is thinned down at the trench bottom, the trench resistivity becomes low. However, this adversely affects the electromigration performance of the trench due to the "short length effect" or the "blech length effect." The short length effect occurs when the copper trench with electromigration blocking boundaries is of a sufficiently short length (e.g., between 1 and 10 micrometers) that the migrating copper atoms impinge on the blocking boundary creating a backwards stress gradient that prevents further migration of copper. It is desirable for the material to have a blocking boundary layer that provides both low resistivity and a high ability to block electromigration.

With continued reduction in sizing of IC components, copper trenches and trenches faces several technical challenges. The limited volume of copper in a trench necessarily limits the current-carrying capability of the trenches. Also, electromigration lifetimes for narrow trenches are reduced. Finally, copper resistivity values increase with a reduction in wire width.

Turning now to an overview of aspects of the present invention, embodiments described herein includes forming an interconnect network of copper, and then replacing the copper in the narrow trenches with another metal, such as a pure metal and/or a metal silicide. These materials provide improved electromigration behavior, are able to carry large current densities, and are less affected by surface scattering effects as compared to copper, which can result in a lower total line resistance than a copper line assuming the same cross-sectional area.

Embodiments of the present invention utilizes a single process to replace the existing copper in narrow trenches of an interconnect network while maintaining the copper in wide trenches. In embodiments, a double-layered copper interconnect structure is used with different formation methods. The copper interconnect network can include two different conductive materials, a first of which is copper in embodiments, and a second of which is not copper. The second conductive (non-copper) layer material functions as a barrier layer, which obviates the need for a barrier layer between two conductive materials. In embodiments, the second conductive layer is cobalt (Co). Other materials that can be used for the second conductive layer include ruthenium (Ru), tungsten (W), molybdenum (Mo), gold (Au), silver (Ag), aluminum (Al), and various alloys thereof. In addition to copper (Cu), other materials can be used for the first conductive material, including copper alloys, cobalt (Co), ruthenium (Ru), tungsten (W), molybdenum (Mo), gold (Au), silver (Ag), aluminum (Al), and various alloys thereof.

Turning now to a more detailed description of embodiments of the present invention, FIG. 1A depicts a graph 100, which shows the resistivity of copper (on a linear scale) on axis 104 in relation to a trench width axis 102 (shown in a logarithmic scale). The graph 100 shows that as trench width decreases, the combined effects of bulk resistivity, grain boundary resistivity, and side wall resistivity combine to markedly increase the total resistivity of copper. This effect becomes pronounced in trench widths below 30 nm and makes copper a less attractive metal to use in narrow trenches.

FIG. 1 demonstrate that copper, while an excellent material for trenches in general applications, begins to lose its ability to meet resistivity requirements as trenches become smaller, specifically below 30 nm in width and 500 nm2 in area. Below these ranges, copper's resistivity increases dramatically, causing an increase in the signal transmission time, and introducing a greater tendency for electromigration effects to occur. Accordingly, embodiments of the present invention incorporate a replacement metal that possesses better characteristics than copper when used in smaller dimension structures such as narrow trenches. Embodiments of the present invention include a process that replaces only the copper in narrow trenches and leaves copper present in wider trenches.

Figure 2:
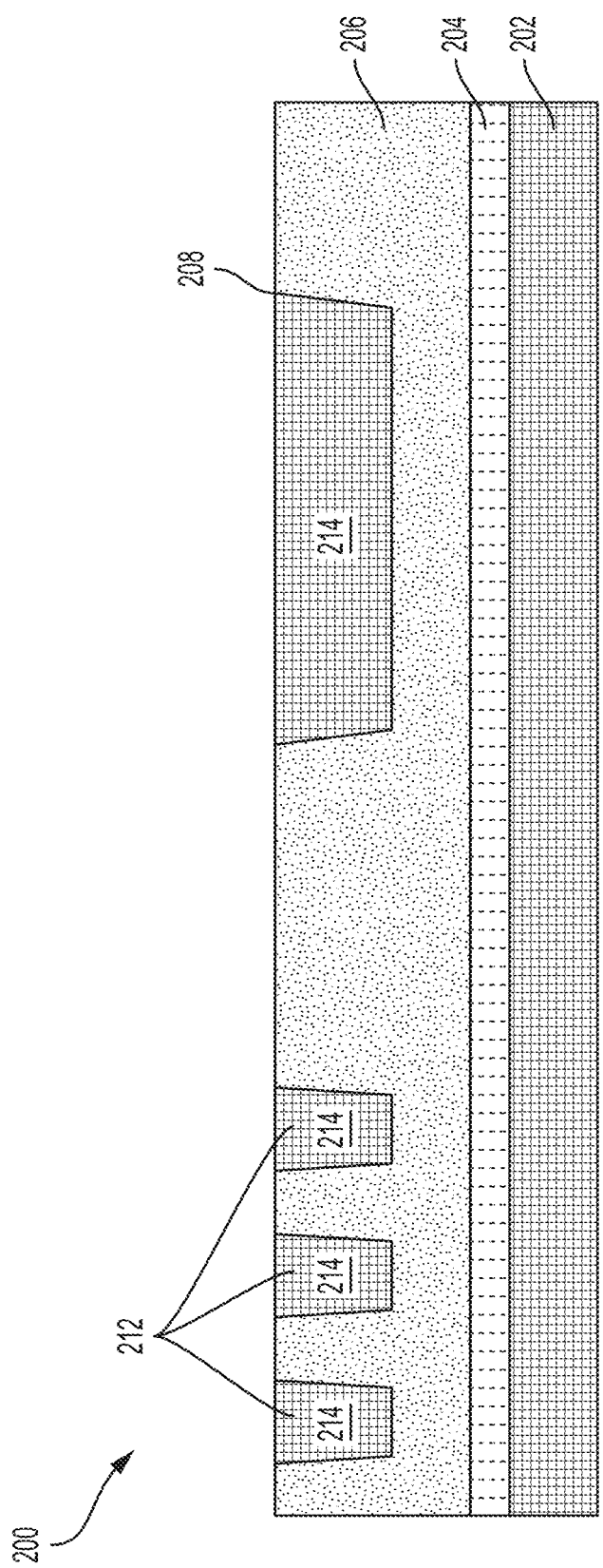
FIG. 2 depicts an exemplary semiconductor structure with narrow and wide copper trenches on a substrate, according to embodiments.

FIG. 2 shows an exemplary semiconductor structure 200 that includes a first conductive layer 202, a diffusion barrier layer 204, a second conductive layer 206, a wide trench or trenches 208, said wide trench 208 having a width greater than 30 nm, a plurality of narrow trenches or trenches 212, each narrow trench 212 having a width less than 30 nm, and a first metal 214 that fills the wide trench 208 and the narrow trenches 212. In embodiments, the narrow and wide trenches 212, 208 respectfully, are formed at the same level or layer. In embodiments, both first conductive layer 202 and trenches 208 and 212 are constructed from copper or a copper alloy. In embodiments, the second conductive layer 206 is constructed from cobalt or a cobalt alloy. In other embodiments, the first metal 214 can include, but is not limited to, copper or a copper alloy or metal or metal silicide including silver, gold, aluminum, rhodium, iridium, tungsten, molybdenum, cobalt, nickel, ruthenium, tungsten silicide, titanium silicide, nickel silicide, or cobalt silicide. In embodiments, a copper-manganese seed and electroplating can be used for the deposition of first conductive layer 202. In embodiments, first conductive layer 202 can be referred to as a copper gap fill layer. A variety of different methods can be used to deposit first conductive layer 202. In embodiments, a vacuum continuous deposition can be used. In embodiments, a copper reflow can be used. Also, in embodiments, the diffusion barrier layer 204 can be one of a variety of different materials, including: tantalum nitride (TaN), titanium nitride (TiN), pyroxmangite (MnSiO3), and tantalum manganese oxide (TaMnO).

Figure 3:
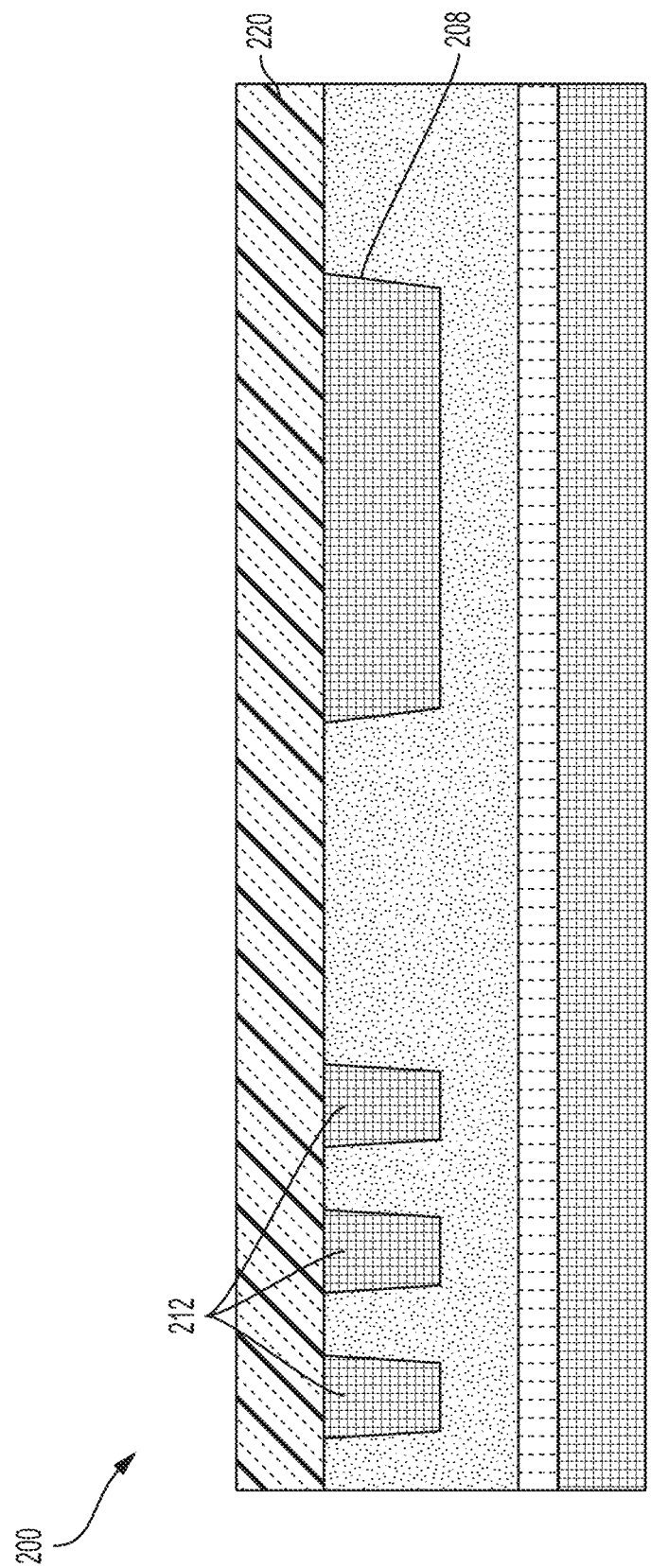
FIG. 3 depicts an exemplary semiconductor structure with a layer of dielectric material that is known to absorb copper atoms, according to embodiments.

FIG. 3, which is a continuation of FIG. 2, illustrates the application of a layer on top of the semiconductor structure 200 of a dielectric material 220. In embodiments, the dielectric 220 includes a material that is known to absorb copper or copper alloy atoms that are being diffused from the narrow and wide trenches 212, 208 respectively. In embodiments, dielectric 220 is made of tetraethyl orthosilicate (TeOS) in a process including disposed trench physical vapor deposition (PVD) or atomic layer deposition (ALD). In other embodiments, other deposition methods might be used. In yet other embodiments, dielectric 220 can include low-K dielectric, an organic planarizing layer (OPL), or a silicon anti-reflective coating layer (SiARC). In embodiments, dielectric 220 might be referred to as a diffusion layer. Once the dielectric 220 has been deposited over the structure 200, a diffusion process begins where copper and/or copper allow atoms, located in the narrow and wide trenches 212, 208, respectively, begin to migrate from the trenches to the dielectric 220. The dielectric 220 is formulated to attract the metal present in the trenches, including copper and copper alloy atoms as required.

Figure 4:
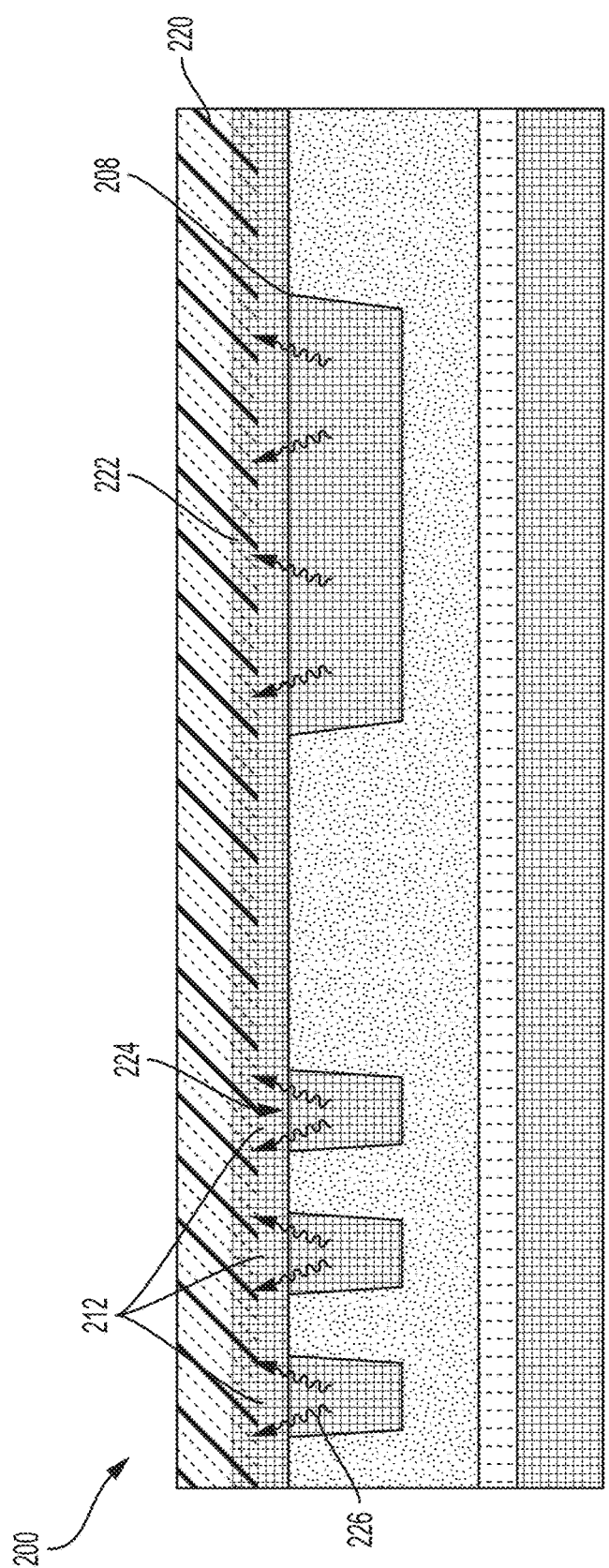
FIG. 4 depicts an exemplary semiconductor structure undergoing an annealing process to diffuse out the copper in the trenches to the dielectric layer, and the evacuation of copper from narrow and wide trenches to the dielectric layer, according to embodiments.

FIG. 4 shows the structure 200 undergoing the migration of copper and copper alloy atoms 226 from the narrow and wide trenches. The migration of the copper atoms includes the migration of copper from the wide trench 222 and migration of copper from narrow trenches 224 to the dielectric 220. In embodiments, an optional step of applying an annealing process to the structure can accelerate the migration process and to increase efficiency of diffusing the metal atoms from the trenches to the dielectric layer. During the migration process, the migrating copper atoms 222, 224 in the wide trenches and narrow trenches, respectfully, move from the trenches to the dielectric and are trapped within the dielectric for later removal. The migration takes place for both narrow and wide trenches simultaneously. In this process, it is desirable to migrate a majority of copper atoms from the narrow trenches 212 while simultaneously migrating only a minority of copper atoms from the wide trenches 208.

Figure 5:
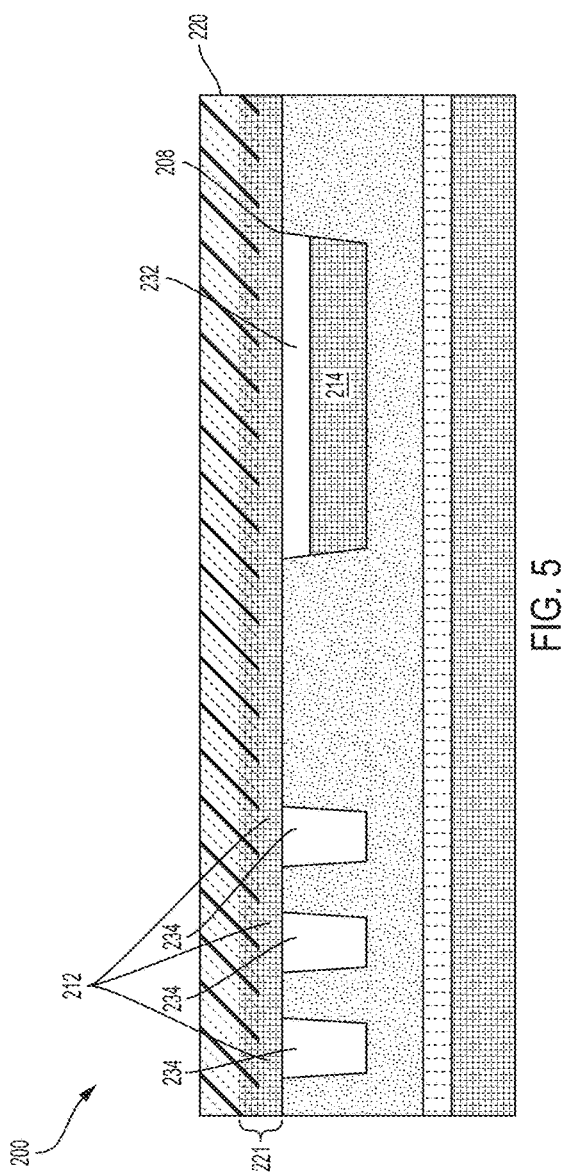
FIG. 5 depicts an exemplary semiconductor structure showing the structure after the evacuation of copper from the trenches is complete according to embodiments.

FIG. 5 illustrates the structure 200 seen in FIG. 4 after the completion of significantly all movement of diffusing metal atoms from the trenches to the dielectric layer 220. The dielectric 220 now includes a region 221 that includes diffused copper atoms contained within it. The narrow trenches 212 are devoid of significantly all metal shown as an empty region 234 while the wide trench 208 still retain a majority of metal and a smaller empty region 232 (less than 50% copper atoms removed). On top of the trenches 208, 212 is the dielectric 220, infused with disassociated metal atoms that have moved from the narrow and wide trenches to the dielectric 220.

Figure 6:
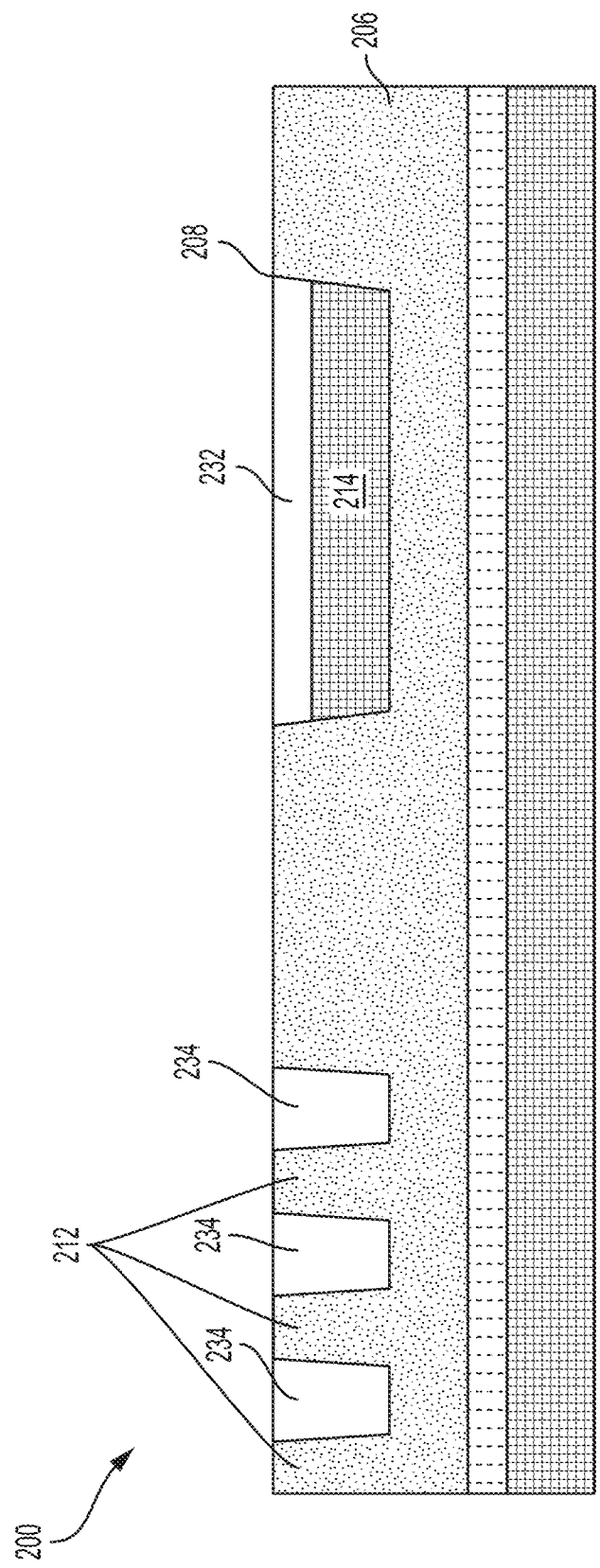
FIG. 6 depicts the exemplary semiconductor structure after the removal of the copper-infused dielectric layer according to embodiments.

FIG. 6 illustrated the structure 200 seen in FIG. 5 after the dielectric layer 220 and the copper-infused dielectric region 221 is removed by an etching or planarization process, to include a chemical/mechanical planarization (CMP) process. The second conductive layer 206 is now exposed. Likewise, the narrow trenches 212 include a region 234 devoid of significant amounts of copper. In a similar manner, the wide trench 208 includes a region 232 devoid of copper while the wide trench 208 still retains significant amounts of copper 214 (greater than 50%).

Figure 7:
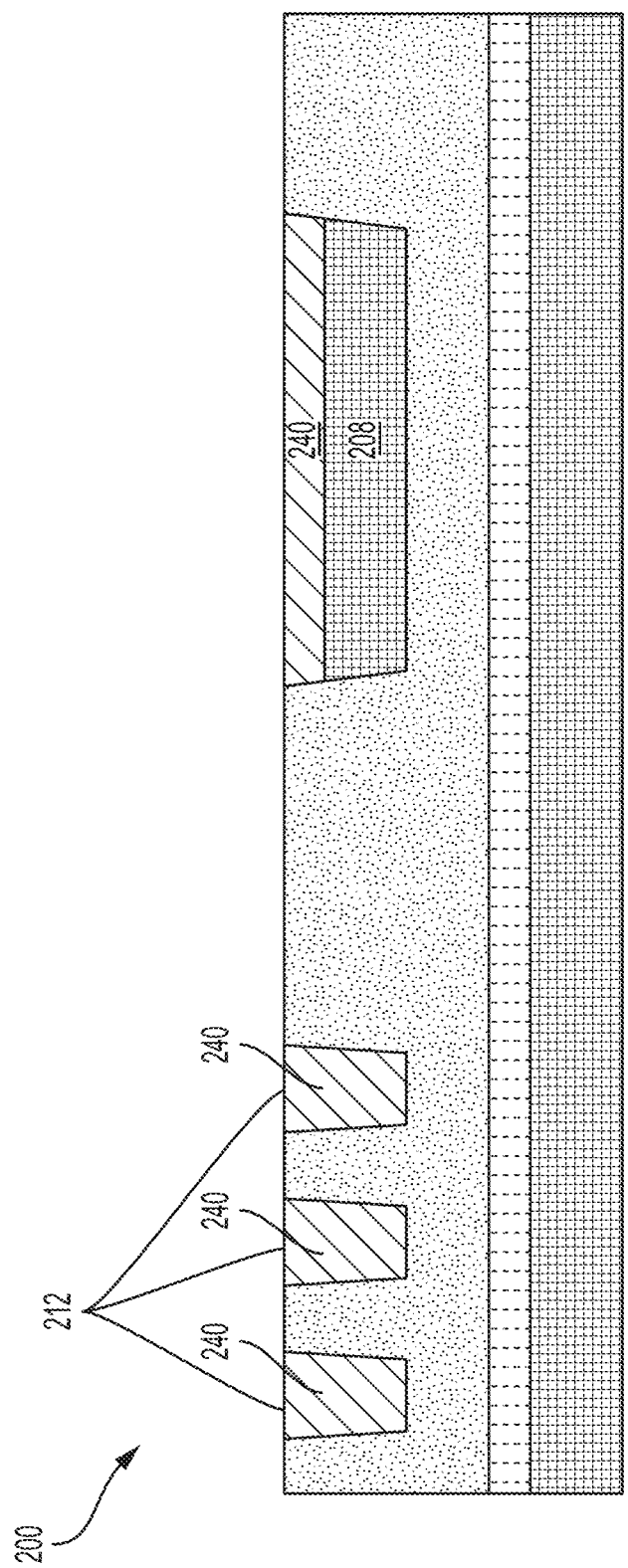
FIG. 7 depicts the exemplary semiconductor structure after the deposition of a metal layer into the narrow and wide trenches according to embodiments.

FIG. 7 shows the structure 200 after a deposition of a second metal process has taken place. In this figure, a second metal 240 has been deposited on the wide trench 208 and the narrow trenches 212 simultaneously. In embodiments, the second metal 240 can include cobalt. In other embodiments, other conductors can be used. These other conductors can include, but is not limited to ruthenium (Ru), tungsten (W), molybdenum (Mo), gold (Au), silver (Ag), aluminum (Al), and various alloys thereof.

Figure 8:
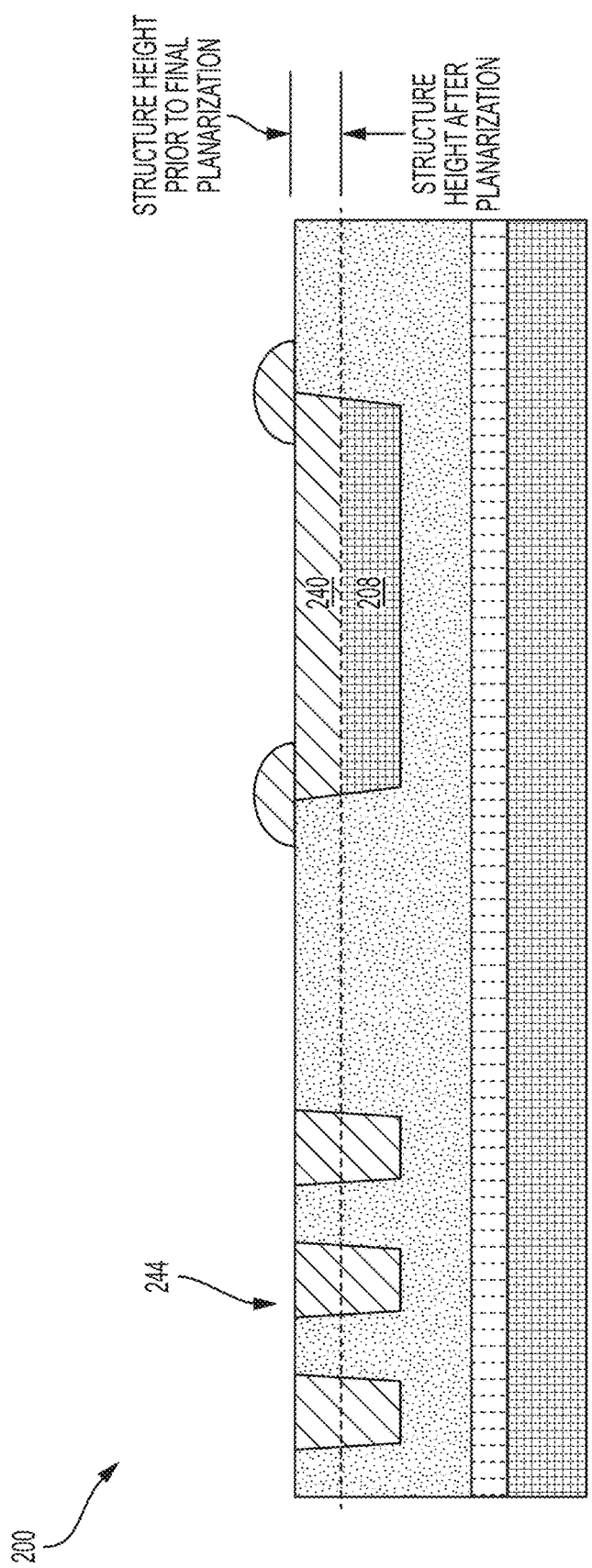
FIG. 8 depicts the exemplary semiconductor structure after a CMP planarization process to remove excess metal from the substrate according to embodiments.

FIG. 8 the structure 200 shows an optional step of conducting a process, to include a CMP process, to remove the second metal 240 from the wide trench. This overburden 244 can be material left on the surface of the structure 200 after the plating process described in FIG. 7. This step can, but is not required to, also remove all of the second metal (240 from FIG. 7) from the wide trench 208. This process also has the effect of decreasing the overall height of the structure 200. Some embodiments include applying a protective layer over the trenches and structure 200 (of FIG. 8) to complete the method of forming trenches of an interconnect network in a substrate as described in the present description.

FIG. 9A depicts a Transmission Electron Microscopy (TEM) or Scanning Transmission Electron Microscopy (STEM) image 250 of a substrate with narrow trenches 212 containing the first metal 214 before the process of removing the first metal 214 is conducted, as described in FIG. 2. In embodiments, the first metal 214 is copper or a copper alloy. The trench width in the image 250 is approximately 26 nm (and less than 30 nm), thus it is desirable to remove the metal 214 and replace it with a second metal as described in this detailed description.

FIG. 9B depicts a TEM image 255 of a substrate with narrow trenches 212 with a dielectric layer 220 added. Additionally, the migration of copper from the narrow trenches 212 to the dielectric 220 has been completed. In this image, regions 234, devoid of copper, are shown.

FIG. 9C depicts a TEM image 260 of a substrate with a wide trench 208 before the process of removing the first metal 214 is conducted, as described in FIG. 2. In embodiments, the first metal 214 is copper or a copper alloy. The trench width in the image 260 is approximately 120 nm (and greater than 30 nm) thus it is not desirable to remove any metal 214.

FIG. 9D depicts a TEM image 265 of a substrate with a wide trench 208 with a dielectric layer 220 added. Additionally, the migration of copper from the wide trench 208 to the dielectric 220 has been completed. In this image, boundary line 236 is shown delineating the interface between a first metal 214 and the dielectric 220. In contrast to FIG. 9B, FIG. 9D does not contain a region devoid of copper, as the boundary line 236 has only slightly moved downward in the region of copper 214.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of embodiments of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for forming trenches of an interconnect network in a substrate, the method comprising:
    forming a first trench of the trenches in the substrate, wherein the first trench comprises a first width dimension;
    forming a second trench of the trenches in the substrate, wherein the second trench comprises a second width dimension that is greater than the first width dimension;
    depositing a first metal layer into the first trench and the second trench;
    applying a dielectric layer over the first metal layer; and
    diffusing first metal atoms of the first metal layer from each of the first trench and the second trench to the dielectric layer, wherein the dielectric layer absorbs the first metal atoms from the first trench leaving the first trench devoid of significantly all of the first metal atoms while simultaneously absorbing only a minority of the first metal atoms from the second trench.

2. The method of claim 1, wherein the first width dimension is less than 30 nm.

3. The method of claim 1, wherein the second width dimension is greater than 30 nm.

4. The method of claim 1, wherein the first trench and the second trench are formed at the same layer or level.

5. The method of claim 1, further comprising:
removing the dielectric layer, including the diffused first metal atoms contained within the dielectric layer;
depositing a second metal layer into the first trench and the second trench; and
applying a protective layer over the first trench and the second trench.

6. The method of claim 1, wherein the first metal layer comprises: copper or a copper alloy; or a metal including silver, gold, aluminum, rhodium, iridium, tungsten, molybdenum, cobalt, nickel, or ruthenium; or a metal silicide including tungsten silicide, titanium silicide, nickel silicide, or cobalt silicide.

7. The method of claim 5, wherein the second metal layer comprises: a metal including silver, gold, aluminum, rhodium, iridium, tungsten, molybdenum, cobalt, nickel, or ruthenium; or a metal silicide including tungsten silicide, titanium silicide, nickel silicide, or cobalt silicide.

8. The method of claim 1, further comprising annealing the dielectric layer after applying the dielectric layer to accelerate the diffusion process and to increase efficiency of diffusing the first metal atoms from the first trench and the second trench to the dielectric layer.

9. The method of claim 1, wherein the dielectric layer comprises an oxide or amorphous carbon.

10. The method of claim 1, further comprising planarizing a surface of the substrate after depositing a second metal layer to remove any second metal overburden.

* * * * *